Oct. 10, 1967 M. BELASCO 3,346,788

GALLIUM ARSENIDE TRANSISTOR AND METHODS OF MAKING SAME

Filed June 15, 1965 2 Sheets-Sheet 1

INVENTOR
Melvin Belasco

BY John D. Graham
ATTORNEY

Oct. 10, 1967 M. BELASCO 3,346,788

GALLIUM ARSENIDE TRANSISTOR AND METHODS OF MAKING SAME

Filed June 15, 1965 2 Sheets-Sheet 2

INVENTOR
Melvin Belasco

BY John G. Graham

ATTORNEY 3,346,788

GALLIUM ARSENIDE TRANSISTOR AND METHODS OF MAKING SAME

Melvin Belasco, Dallas, Tex., assignor to Texas Instruments Incorporated, Dallas, Tex., a corporation of Delaware Filed June 15, 1965, Ser. No. 463,989
8 Claims. (Cl. 317—237)

ABSTRACT OF THE DISCLOSURE

Disclosed are methods of forming shallow P-type diffused regions in N-type gallium arsenide, methods of forming base impurity distributions in NPN GaAs transistors which have low surface concentrations and approximately complementary error function distribution, methods of fabricating NPN GaAs transistors, and NPN GaAs transistors with $h_{FE}$ values greater than 1.

This invention relates to semiconductor devices, and more particularly to methods of making compound semiconductor transistors and similar devices.

One way of specifying the quality or figure of merit of a transistor is by stating the DC common emitter forward current transfer ratio ($h_{FE}$). In the past, extreme difficulty has been encountered in trying to produce NPN gallium arsenide transistors with values of $h_{FE}$ greater than 1. Although a number of factors affect the value of $h_{FE}$ obtainable from a transistor, such as the base width, emitter efficiency, the collector efficiency, etc., no method has heretofore been devised which consistently produced gallium arsenide transistors with high values of $h_{FE}$.

It is therefore an object of this invention to provide a method of making gallium arsenide transistors which exhibit high values of $h_{FE}$. Another object is to provide gallium arsenide transistors with thin diffused base layers and methods of making same. A further object is to provide a method of making diffused P-type layers having impurity distributions suitable for use as the base layer in an NPN gallium arsenide transistor. A still further object is to provide methods of rapidly producing thin diffused layers in gallium arsenide wherein the distribution of impurities in the diffused layer is suitable for use as the base layer in an NPN gallium arsenide transistor.

In accordance with the invention, an NPN gallium arsenide transistor which exhibits $h_{FE}$ values of greater than 5 is produced by diffusing by conventional vapor-solid diffusion techniques a P-type impurity such as magnesium or zinc into the surface of an N-type gallium arsenide wafer to form a P-type layer approximately 6 to 10 microns thick. The P-type surface layer is then etched until reduced to about 1 to 2 microns in thickness. The wafer is then processed in the conventional manner to form an NPN gallium arsenide transistor, the 1 to 2 micron thick P-type layer serving as the base. It should be noted that although $h_{FE}$ is related to the thickness of the transistor base according to the expression $$h_{FE} \sim \frac{1}{W_b 2}$$

where $W_b$ is the thickness of the transistor base, the thickness of the base layer in the transistor described herein does not of itself account for the high values of $h_{FE}$ observed.

Conventional methods of making gallium arsenide transistors, whereby a diffused base layer of 1 to 2 microns in thickness is formed by the diffusion of a P-type impurity into an N-type wafer, the wafer then being further processed to form an NPN gallium arsenide transistor, do not produce transistors having high values of $h_{FE}$. However, when a P-type layer of several times the thickness required to form the base layer is formed by diffusion and then reduced to the desired width of the base layer, transistors are produced having desirably high values of $h_{FE}$. A particular advantage of the invention is the production of NPN gallium arsenide transistors having high values of $h_{FE}$ by the diffusion of conventional P-type impurities to form the base layer. Critical control over the diffusion depth of the diffused layer is not necessary since the diffusion depth can be directly measured after diffusion and reduced to the desired thickness by controlled etching or abrasion. A further advantage is the production of a P-type diffused layer wherein the distribution of impurities is approximately a complementary error function distribution over the thickness of the layer. Furthermore, the concentration of P-type impurities at the surface of the wafer is low enough to be compatible with emitters formed by diffusion of Group VIa elements such as sulfur, selenium and tellurium.

These and other objects, advantages and features of the invention will become more readily understood in the following detailed description when read in conjunction with the appended claims and attached drawings, in which:

Similar reference characters denote corresponding parts throughout the several views of the drawing.

Figures 1, 2, 3, 4:
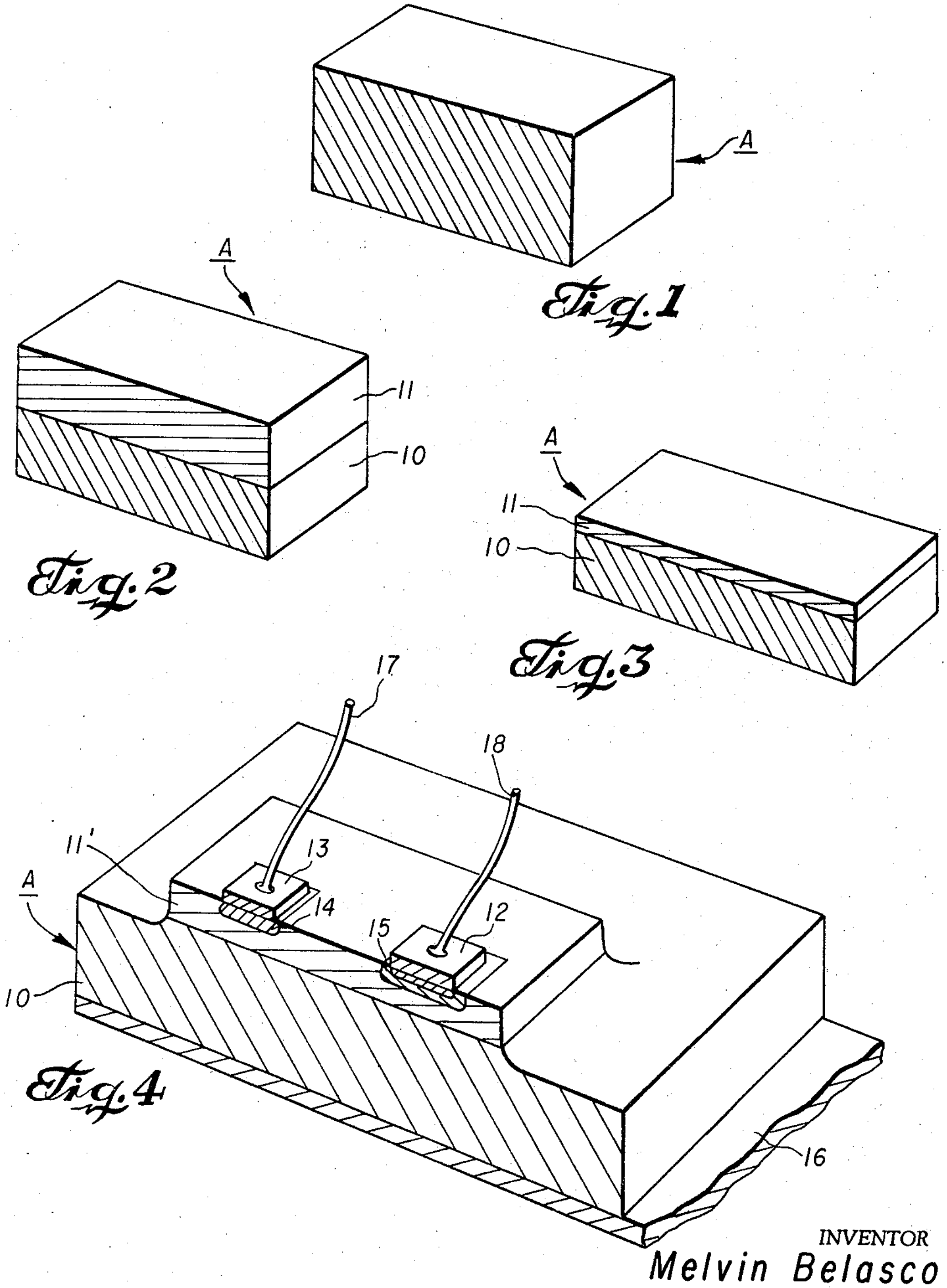
FIGURE 1 is a perspective view in section of an N-type gallium arsenide wafer.
FIGURE 2 is a perspective view in section of an N-type gallium arsenide wafer having a P-type layer diffused therein.
FIGURE 3 is a perspective view in section of the wafer of FIGURE 2 after the P-type layer has been reduced in thickness.
FIGURE 4 is a perspective view partially in section of an NPN gallium arsenide transistor utilizing the base layer of reduced thickness as shown in FIGURE 3.

In FIGURE 1 an N-type gallium arsenide wafer designated by the general reference character A is shown. A P-type diffused layer 11, as shown in FIGURE 2, is formed in wafer A by the diffusion of P-type conductivity determining impurities such as zinc, cadmium, manganese or magnesium, for example, thereinto by any suitable conventional vapor-solid diffusion technique. In the preferred embodiment of the invention, wafer A is an N-type gallium arsenide wafer having approximately $1 \times 10^{16}$ impurities per cubic centimeter, which has been lapped and polished to about 30 mils thickness. As indicated in the steps of the method shown in FIGURE 7, wafer A is then placed in a quartz ampoule of about 100 cubic centimeters which also contains approximately 0.5 milligram of arsenic and 0.5 milligram of magnesium. The quartz ampoule is then evacuated, sealed and placed in a furnace at approximately 1100° C. for about 75 minutes. Under these conditions a P-type layer 11 is formed by the diffusion of the P-type impurities into the wafer A, the P-type layer being approximately 10 microns deep. The remainder of the wafer A is unaffected by the diffusion and retains its original N-type conductivity. Thus a wafer is formed as shown in FIGURE 2, having a region of P-type conductivity 11 adjacent a region of N-type conductivity 10.

After diffusion, the thickness of the P-type diffused layer is measured and the wafer masked so that only the top surface of the P-type layer is exposed. The exposed surface is then subjected to suitable etching solution for a sufficient period of time to allow the etchant to dissolve the exposed surface of the P-type layer and reduce the thickness thereof to about 1 to 2 microns. Each step of the process is schematically depicted in FIGURE 7.

Alternatively, the thickness of the diffused P-type layer can be reduced by lapping with a fine abrasive. Other suitable conventional techniques for reducing the thickness of gallium arsenide wafers may also be employed.

Figure 7:
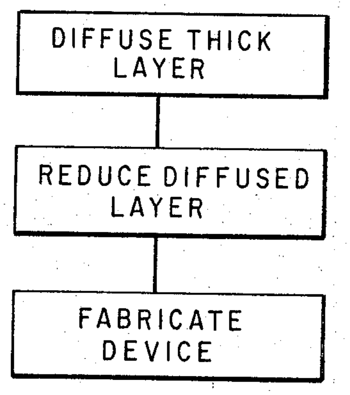

To carry out the second step of the method indicated in FIGURE 7, the wafer of FIGURE 2 is secured to the surface of a lapping block of Telfion with paraffin wax. A small portion of the wafer is then lapped or ground at an angle of 5° from the surface. The lapped area is then cleaned and stained with a solution of 50 milligrams potassium hydroxide (KOH) in 25 milliliters of $H_2O$. When this solution is placed on the lapped surface and the PN junction forward biased, the P-type layer is stained a metallic grey. The thickness of the layer 11 is then computed by measuring the width of the stained region.

After the thickness of the P-type layer has been determined, the wafer, still mounted on the Telflon block, is submerged in an etching solution of $H_2SO_4/H_2O/H_2O_2$ (8/1/1). The paraffin wax protects the edges of the wafer and the surface adjacent the block, but the exposed surface is attacked by the etchant solution and removed at a rate of approximately 0.40 micron per minutes. When the desired junction depth is obtained, the block and wafer are removed from the etching solution and rinsed with deionized water.

A particular advantage of this technique is that while the wafer is still mounted on the Telflon block, the thickness of the P-type layer can be re-measured to ascertain the exact thickness of the layer. When the thickness of the P-type layer has been reduced to the thickness desired for the base region of the transistor, the wafer may be removed from the Teflon block with a solvent which dissolves the paraffin wax. The resultant wafer is shown in FIGURE 3 wherein wafer A comprises an N-type region 10 having a thin layer of P-type material 11 thereon.

The wafer A of FIGURE 3 is then further processed by conventional methods to form an NPN gallium arsenide transistor.

An NPN gallium arsenide transistor as shown in FIGURE 4 may be formed from the wafer of FIGURE 3 by masking and etching the top surface of the P-type layer 11 to form a mesa 11' of P-type material on the N-type portion 10 of the wafer A. Emitter and base contacts 12 and 13, respectively, are then formed by evaporation of suitable contact materials in the desired configurations by conventional techniques. When the contacts 12 and 13 are alloyed into the P-type mesa 11', an ohmic regrowth region 14 is formed under the base contact 13. The emitter contact 12, which contains an N-type dopant such as tin, sulfur, selenium or tellurium, forms an N-type region 15 when alloyed with the gallium arsenide. The N-type region 15 may be formed by the diffusion of donor impurities from the contact alloy 12 or by the formation of a regrowth region saturated with the constitutents of the contact alloy. An ohmic connection such as a strip of a gold-selenium alloy 16 is attached to the back surface of the N-type wafer 10, and suitable leads such as gold wires 17 and 18 are attached to the base and emitter contacts, respectively. Thus, an NPN gallium arsenide transistor is produced wherein the original N-type wafer 10 constitutes the collector, the remaining portion of the P-type diffused layer 11' constitutes the base, and the N-type region 15 constitutes the emitter.

Figure 5:
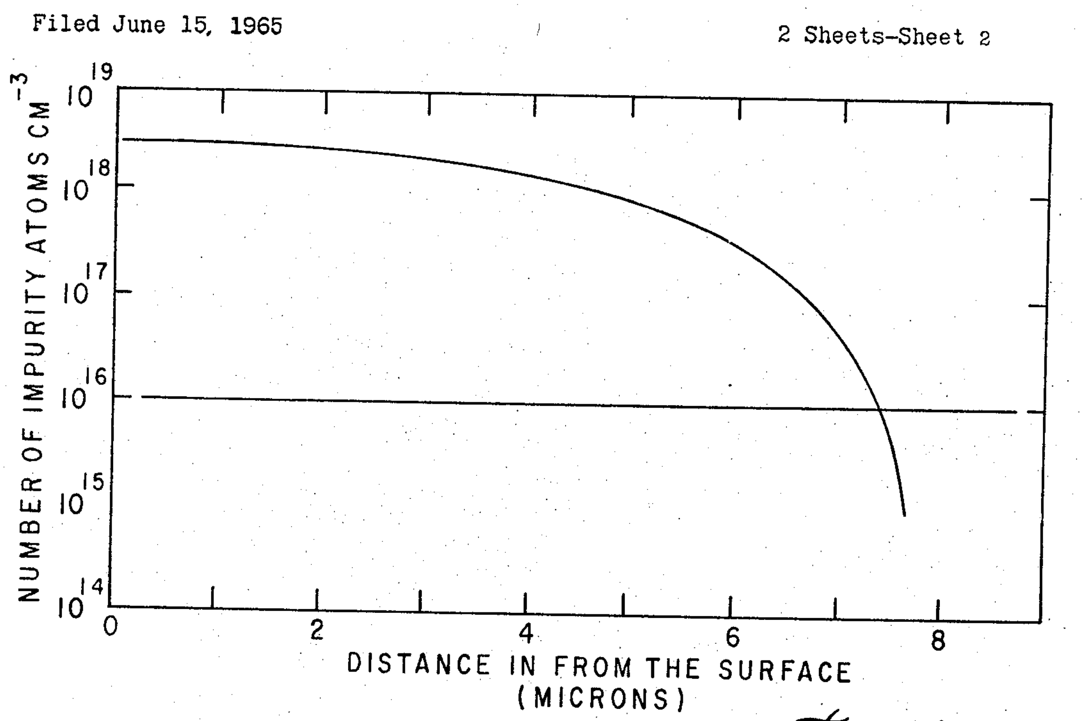
FIGURE 5 is a graphic illustration of P-type impurity distribution in a P-type diffused layer.
Figure 6:
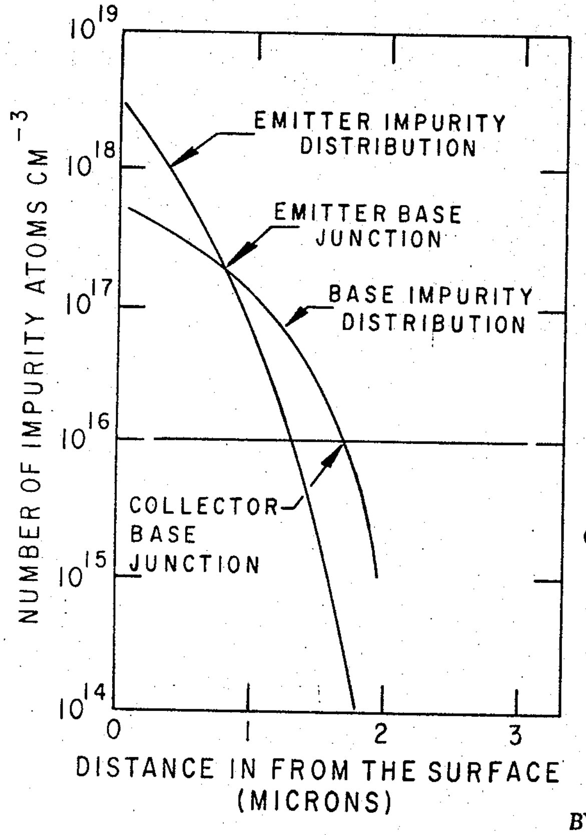
FIGURE 6 is a graphic illustration of the distribution of N-type and P-type impurities in a transistor base layer produced in accordance with the invention; and, FIGURE 7 is a flow diagram of the process steps of the invention.

The advantages of the method of the invention are graphically illustrated in FIGURES 5 and 6. In FIGURE 5 the magnesium distribution in a magnesium diffused P-type layer is illustrated. The distribution shown is typically observed when an N-type gallium arsenide wafer is maintained at 1100° C. for 75 minutes in enclosed diffusion ampoule containing 0.5 milligram arsenic and 0.5 milligram magnesium as set out above. Under these conditions the resultant impurity distribution curve is relatively flat over about the first two-thirds of the diffused layer and then changes to a distribution which is approximately complementary error function over the last one-third. This distribution is characteristic of most known acceptor impurities when diffused into gallium arsenide.

By removing approximately the first two-thirds of the P-type layer, the remaining P-type layer has an impurity distribution as shown in FIGURE 6 and designated base impurity distribution. It will be noted that the impurity distribution over the range from about $5\times10^{17}$ atoms/cm.$^3$ at the surface to the point where the P-type impurity concentration is equal to the residual donor concentration in the original material ($10^{16}$ atoms/cm.$^3$) is approximately complementary error function. Furthermore, the surface concentration is sufficiently low to allow over-compensation by the N-type impurities of the emitter, thereby permitting the use of materials for the emitter impurity which have a solid solubility in gallium arsenide which is less than the original surface concentration of the P-type diffused layer. Thus the emitter-base junction occurs at a point on the distribution curve corresponding to about $2\times10^{17}$ atoms/cm.$^3$; approximately an order of magnitude lower than would have been obtained if the original surface of the diffused layer had not been removed. Furthermore, the surface concentration of the donor impurity in the emitter region is an order of magnitude higher than the concentration at the emitter-base junction when the base layer of the transistor is produced in accordance with the invention. Consequently donor impurities, such as sulfur, which have low solid solubility limits in gallium arsenide or which are difficult to diffuse into gallium arsenide in concentration higher than about $6\times10^{17}$ atoms/cm.$^3$ may be used for the emitter dopant. It should also be noted that the invention utilizes acceptor impurities which characteristically have high diffusion constants, thus affording rapid formation of P-type diffused layer. However, since acceptor impurities with high diffusion constants characteristically have impurity distributions as shown in FIGURE 5, the high concentration portion of the diffused layer is removed to produce a satisfactory diffused layer.

It is to be understood that the transistor configuration shown and described with reference to FIGURE 4 is the preferred embodiment utilizing the thin P-type layer formed in accordance with this invention. Other configurations such as planar devices and devices having diffused or alloyed emitter regions may also be formed utilizing the P-type layer formed in accordance with this invention. Other advantages and features of the invention will become readily apparent to those skilled in the art.

It is to be understood that the form of this invention herewith shown and described is to be taken as a preferred example of the same and that various changes may be resorted to without departing from the spirit and scope of the invention as defined by the appended claims.

What is claimed is:

1. A body of gallium arsenide having an N-type conductivity region and a layer of P-type conductivity adjacent one surface thereof forming a PN junction within said body, the concentration of P-type impurities in said layer of P-type conductivity being about $5\times10^{17}$ atoms/cm.$^3$ at the surface thereof and decreasing with distance toward said PN junction in approximately complementary error function distribution.

2. An NPN gallium arsenide transistor comprising:

(a) a collector region of N-type gallium arsenide, said collector region containing a substantially uniform distribution of donor impurities in a concentration of about $10^{16}$ atoms/cm.$^3$;

(b) a diffused base region of P-type gallium arsenide, said base region being contiguous with said collector region and containing magnesium in a distribution varying in concentration from about $5\times10^{17}$ atoms/cm.$^3$ at the surface of said diffused base region to about $10^{16}$ atoms/cm.$^3$ at the base-collector junction;

(c) an emitter region of N-type gallium arsenide, said emitter region being contiguous with said base region and containing sulfur in a distribution varying in concentration from about $3\times10^{18}$ atoms/cm.$^3$ at the surface of said emitter region to about $1.5\times10^{17}$ atoms/cm.$^3$ at the emitter-base junction; and (d) electrodes electrically attached to each of said emitter, base, and collector regions.

3. In the method of making a gallium arsenide transistor including the steps of diffusing acceptor impurities into an N-type gallium arsenide substrate to form a P-type disffused region for the base region of said transistor, the step of etching the surface of said diffused region to reduce the thickness of said region to a predetermined thickness.

4. The method of making a gallium arsenide transistor including the steps of:

(a) forming a P-type conductivity region in an N-type conductivity gallium arsenide wafer by diffusing P-type conductivity-determining impurities thereinto; and (b) etching the surface of said P-type conductivity region to reduce the thickness of said region to less than about one third of its original thickness.

5. In a process for making a gallium arsenide transistor, the steps of:

(a) diffusing magnesium into the surface of an N-type gallium arsenide wafer, thereby forming a P-type layer about 10 microns thick; and (b) etching the surface of said P-type layer to reduce the thickness of said layer to about one micron.

6. In the process of making a gallium arsenide transistor, the steps of:

(a) diffusing P-type conductivity-determining impurities into a portion of an N-type conductivity gallium arsenide substrate, thereby to form a diffused P-type layer of greater thickness than required for the base layer of said transistor;

(b) reducing the thickness of said P-type layer to less than one third its original thickness, thereby forming the base layer of said transistor;

(c) forming an N-type emitter region in said base layer; and (d) attaching leads to said base layer and said emitter region.

7. In a process for making a gallium arsenide transistor, the steps of:

(a) diffusing P-type conductivity-determining impurities into an N-type gallium arsenide substrate; thereby forming a P-type diffused region; and (b) reducing the thickness of said P-type diffused region to less than one third of the original thickness of said diffused region.

8. The method of making an NPN gallium arsenide transistor comprising the steps of:

(a) diffusing magnesium into at least part of the surface of a body of N-type gallium arsenide to produce a P-type diffused layer about 6 to about 10 microns thick;

(b) reducing the thickness of said P-type diffused layer to about 1 to 2 microns;

(c) attaching a substantially ohmic contact to said P-type layer;

(d) diffusing sulfur into part of said P-type layer, thereby forming an N-type emitter region in said P-type layer;

(e) attaching an electrical contact to said N-type emitter region; and (f) attaching a substantially ohmic contact to said body of N-type gallium arsenide.

References Cited

UNITED STATES PATENTS

| | | | |
|---|---|---|---|
| 2,814,853 | 12/1957 | Paskell | 317—235 X |
| 3,261,727 | 7/1966 | Dehmelt et al. | 317—235 X |

JOHN W. HUCKERT, *Primary Examiner.*

A. M. LESNIAK, *Assistant Examiner.*